United States Patent
Menard

(10) Patent No.: US 8,338,855 B2
(45) Date of Patent: Dec. 25, 2012

(54) VOLTAGE-CONTROLLED BIDIRECTIONAL SWITCH

(75) Inventor: Samuel Menard, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 13/242,626

(22) Filed: Sep. 23, 2011

(65) Prior Publication Data

US 2012/0012891 A1    Jan. 19, 2012

Related U.S. Application Data

(63) Continuation of application No. 12/026,121, filed on Feb. 5, 2008, now abandoned, which is a continuation of application No. 11/304,247, filed on Dec. 15, 2005, now abandoned.

(30) Foreign Application Priority Data

Dec. 15, 2004 (FR) ..................................... 04 52991

(51) Int. Cl.
H01L 29/747 (2006.01)

(52) U.S. Cl. .. 257/124; 257/119; 257/125; 257/E29.215

(58) Field of Classification Search .............. 257/119, 257/124, 125, E29.215
See application file for complete search history.

(56) References Cited

U.S. PATENT DOCUMENTS

| | | |
|---|---|---|
| 5,608,235 A | 3/1997 | Pezzani |
| 5,625,214 A | 4/1997 | Kinoshita et al. |
| 5,923,055 A | 7/1999 | Schlangenotto et al. |
| 6,034,381 A | 3/2000 | Pezzani |

FOREIGN PATENT DOCUMENTS

| | | |
|---|---|---|
| JP | 63-244881 | 12/1988 |
| JP | 05235363 A | 9/1993 |

OTHER PUBLICATIONS

French Search Report from French Patent Application 04/52991, filed Dec. 15, 2004.

Sanchez et al., "Realization of vertical P+ walls through-wafer for bi-directional current and voltage power integrated devices," ISPSD 2003, Apr. 14-17, Cambridge, UK.

*Primary Examiner* — Jerome Jackson, Jr.
*Assistant Examiner* — Yu Chen
(74) *Attorney, Agent, or Firm* — Wolf, Greenfield & Sacks, P.C.

(57) ABSTRACT

A voltage-controlled vertical bi-directional monolithic switch, referenced with respect to the rear surface of the switch, formed from a lightly-doped N-type semiconductor substrate, in which the control structure includes, on the front surface side, a first P-type well in which is formed an N-type region, and a second P-type well in which is formed a MOS transistor, the first P-type well and the gate of the MOS transistor being connected to a control terminal, said N-type region being connected to a main terminal of the MOS transistor, and the second main terminal of the MOS transistor being connected to the rear surface voltage of the switch.

10 Claims, 4 Drawing Sheets

VOLTAGE-CONTROLLED BIDIRECTIONAL SWITCH

CROSS REFERENCE TO RELATED APPLICATIONS

This application is a continuation of U.S. application Ser. No. 12/026,121 filed Feb. 5, 2008, which is a continuation of U.S. application Ser. No. 11/304,247, filed Dec. 15, 2005 entitled VOLTAGE-CONTROLLED BIDIRECTIONAL SWITCH, which application claims the priority benefit of French patent application number 04/52991, filed on Dec. 15, 2004, entitled VOLTAGE-CONTROLLED BIDIRECTIONAL SWITCH, which is hereby incorporated by reference to the maximum extent allowable by law.

BACKGROUND OF THE INVENTION

1. Field of the Invention

The present invention relates to the field of bi-directional switches, and more specifically of bi-directional switches made in the form of vertical components in which the signal applied to the control electrode is applied with reference to the voltage of the rear surface of the component, which usually is, in vertical components, uniformly metallized.

2. Discussion of the Related Art

This type of component is described in U.S. Pat. No. 6,034,381 to Robert Pezzani, assigned to the present assignee, which is incorporated herein by reference.

FIGS. 1A, 1B, 1C reproduce FIGS. 1A, 1B, and 1C of U.S. Pat. No. 6,034,381.

The structure of FIG. 1A is formed from a lightly-doped N-type semiconductor substrate 1. This bi-directional switch comprises two vertical thyristors Th1 and Th2 in antiparallel. The anode of thyristor Th1 corresponds to a P-type layer 2 formed on the rear surface side of the substrate. Its cathode corresponds to a region 3 of the second conductivity type formed on the front surface side in a P-type well 4. The anode of thyristor Th2 corresponds to a P-type well 5 formed on the front surface side and its cathode corresponds to an N-type region 6 formed on the rear surface side in layer 2. This bi-directional switch is of the so-called well type, that is, its periphery is formed of a heavily-doped P-type wall 7 extending from the front surface side to P-type rear surface layer 2. The rear surface is coated with a metallization M1 corresponding to a first main terminal A1 of the bi-directional switch and the upper surfaces of regions 3 and 5 are coated with a second metallization M2 corresponding to the second main terminal A2 of the bi-directional switch.

The starting structure of this bi-directional switch comprises a P-type well 10 formed on the front or upper surface side in which is formed an N-type region 11. The surface of well 10 is solid with a metallization M3 connected to a gate terminal G of the bi-directional switch and the surface region 11 is connected by a metallization M4 to the upper surface of heavily-doped P-type peripheral wall 7.

The symbols of various components resulting from the shown structure have already been shown in FIG. 1A. Thus, the above-mentioned thyristors Th1 and Th2 and a transistor T1 having its base corresponding to well 10 and to gate metallization G, having its emitter corresponding to region 11 and to metallization M4 (that is, this emitter is connected by well 7 to first main rear or lower surface electrode A1 of the bi-directional switch), and having its collector corresponding to substrate 1, that is, to the anode-gate regions of thyristors Th1 and Th2, have been shown.

Currently, such a bi-directional switch is assembled so that its rear surface, generally connected to a radiator, is connected to ground and so that its front surface is connected to a voltage which is alternately positive and negative with respect to ground.

U.S. Pat. No. 6,034,381 patent shows that a bi-directional switch structure in which control electrode G is arranged on the front surface and in which the bi-directional switch is started by application on control electrode G of a signal of positive biasing with respect to the voltage of rear surface electrode A1 is obtained.

Structures of the type described in FIG. 1 have been manufactured by STMicroelectronics which has also filed several patents aiming at improvements of this structure.

However, this structure has the disadvantage that, as in the case of a conventional triac, the control is performed by current injection. Now, it is always easier to control a switch with a voltage source than with a current source.

SUMMARY OF THE INVENTION

Thus, an object of the present invention is to provide a bi-directional switch in which the control is referenced to the rear surface voltage and which is voltage-controlled.

To achieve this and other objects, the present invention provides a voltage-controlled vertical bi-directional monolithic switch, referenced with respect to the rear surface of the switch, formed from a lightly-doped N-type semiconductor substrate, in which the control structure comprises, on the front surface side, a first P-type well in which is formed an N-type region, and a second P-type well in which is formed a MOS transistor, the first P-type well and the gate of the MOS transistor being connected to a control terminal, said N-type region being connected to a main terminal of the MOS transistor, and the second main terminal of the MOS transistor being connected to the rear surface voltage of the switch.

According to an embodiment of the present invention, the monolithic structure is surrounded with a heavily-doped P-type wall in contact with a rear surface metallization, the connection between the second main terminal of the MOS transistor and the voltage of the rear surface being ensured by a metallization connecting this second main terminal to the upper surface of said wall.

According to an embodiment of the present invention, the connection between the control terminal and, on the one hand, the first P-type well and, on the other hand, the gate, is ensured via respective resistors, the first resistance between the control terminal and a contact on the first well being high and the second resistance between the control terminal and the gate being low.

According to an embodiment of the present invention, the first resistance is on the order of some hundred kilo-ohms and the second resistance is smaller than 100 ohms.

According to an embodiment of the present invention, the switch comprises, on the rear surface side, between the semiconductor structure and the rear surface metallization, an insulating layer extending at least under the control area and not under the power area.

The foregoing object, features, and advantages of the present invention, as well as others, will be discussed in detail in the following non-limiting description of specific embodiments in connection with the accompanying drawings.

DETAILED DESCRIPTION

Figure 1A:
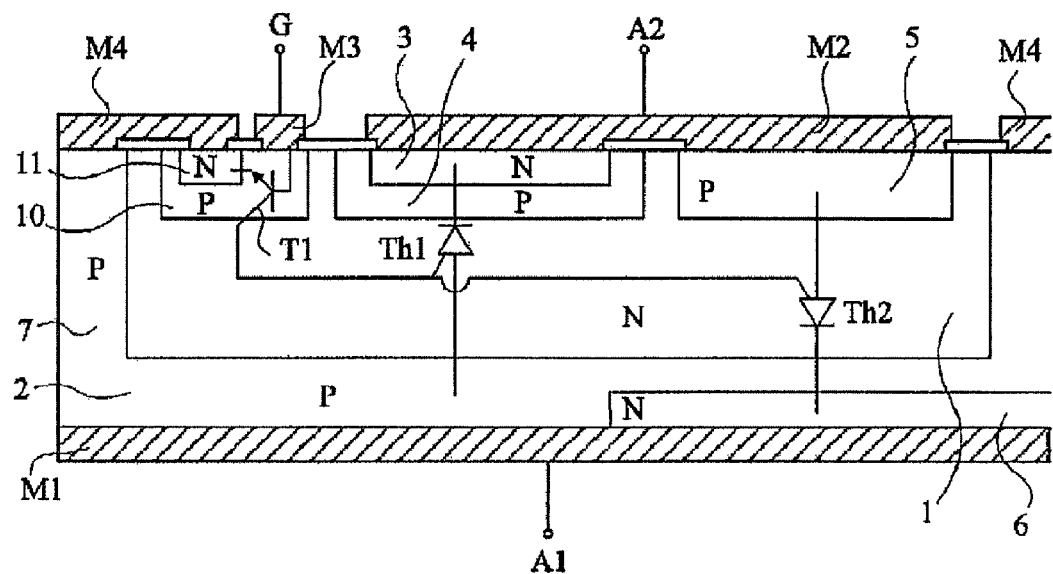
FIGS. 1A, 1B, and 1C respectively are a simplified cross-section view and equivalent diagrams of a structure of a bi-directional voltage-controlled switch according to U.S. Pat. No. 6,034,381.
Figure 1B:
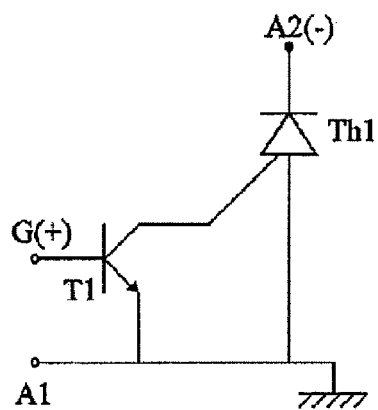
Figure 1C:
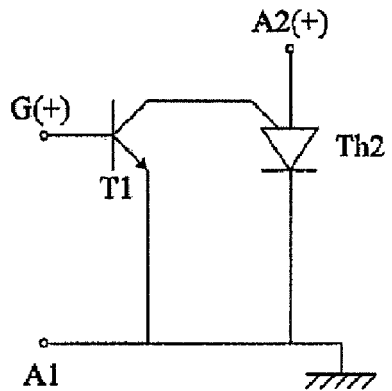

For clarity, the same elements have been designated with the same reference numerals in the different drawings. Further, as usual in the field of the representation of semiconductor components, the various cross-section views are extremely simplified and are not to scale. For an example of practical implementation, reference may be made to the top and bottom views of FIGS. 3 and 4.

Figure 2A:
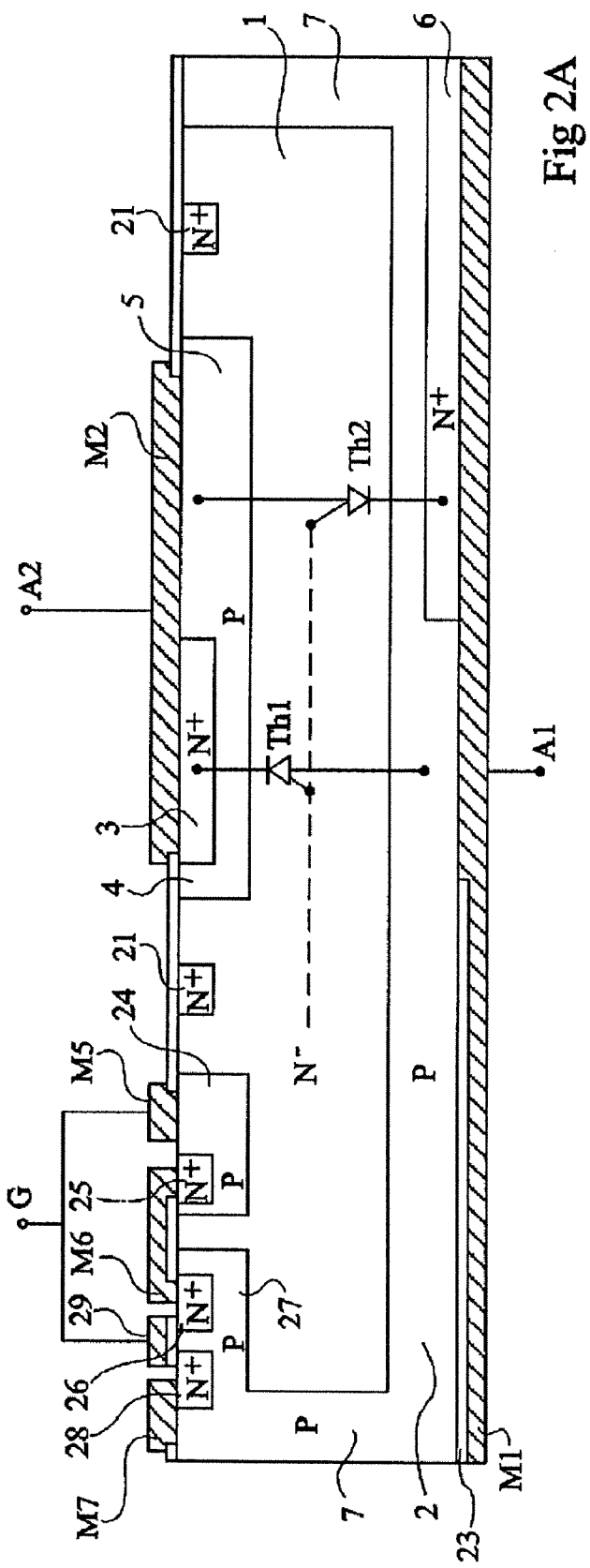
FIGS. 2A and 2B respectively are a simplified cross-section view and an equivalent diagram of a structure of a bi-directional voltage-controlled switch according to the present invention.

FIG. 2A is a simplified cross-section view of an embodiment of a voltage-controlled bi-directional switch according to the present invention.

In this drawing, elements similar to those already described in relation with FIG. 1A bear the same reference numerals. Thus, a thyristor Th1 having its anode on the side of lower metallization M1 and comprising regions or layers 2-1-4-3 and a thyristor Th2 having its anode on the upper surface side and which comprises region and layer portions 5-1-2-6 can be found in FIG. 2A, between terminals A1 and A2.

In FIG. 2A, wells 4 and 5 of thyristor Th1 and of thyristor Th2 have been shown as portions of a same well. However, the same arrangement as in FIG. 1A would be possible (forming of wells 4 and 5 in two parts). Further, an optional channel stop ring 21 which surrounds the entire well 4-5 has been shown.

Further, an insulating layer 23 which is substantially located on the entire lower surface outside of the opposite portion of well 4 appears on the lower surface side between metallization M1 and P-type layer 2. The arrangement of this layer will be better understood with reference to the bottom views of FIGS. 3B and 4B. The function of this insulating layer is to favor the switch starting by bringing the charge carriers generated in the control area to propagate to the power area (thyristor Th1 and Th2) after a control signal is applied. An $N^+$-type layer would have a similar function.

The control area comprises a first P-type well 24 in which is formed an N-type region 25. This well and this region are designated with reference numerals different from those of well 10 and of region 11 of FIG. 1A since, as will be seen hereafter, the doping level and the depth of well 24 are preferably distinct from what has been previously described in prior art. A metallization M5 is in contact with well 24. N-type region 25 is connected by a metallization M6 to an $N^+$-type source region 28 of a MOS transistor T3 formed in a P-type well 27. MOS transistor T3 comprises an $N^+$-type drain region 26 and its P-type channel forming area is topped with a conductive gate 29. A metallization M7 connects region 28 to heavily-doped P-type peripheral wall 7 to establish a contact with rear-surface P-type region 2 and metallization M1. A gate terminal G forms one piece with metallization M5 and with gate 29 of the MOS transistor, preferably via resistors which are shown in the equivalent diagram of FIG. 2B and which can be formed in integrated form although they are not shown in FIG. 2A.

Well 27 may, as shown, be contiguous to peripheral wall 7 or else be a separate well, the connection between drain 26 and the upper surface of this wall being ensured by metallization M7. Further, MOS transistor T3 has been shown very schematically. Any variation of such a transistor may be used. Especially, the MOS transistor may conventionally have a multiple-cell structure by using, for example, a structure with two metallizations to establish the contacts.

Figure 2B:
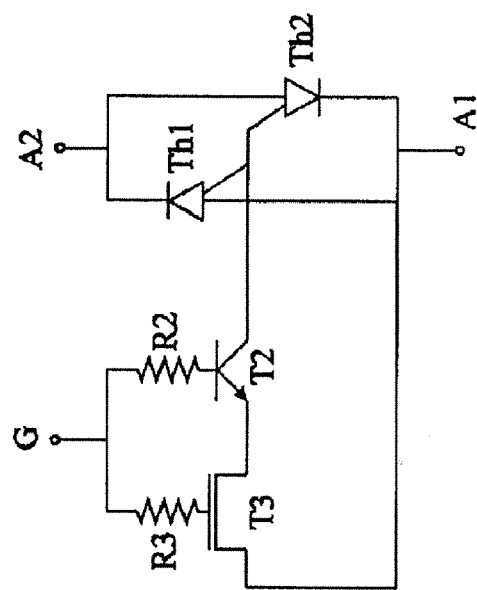

An equivalent diagram of this bi-directional switch is illustrated in FIG. 2B. An NPN transistor T2 having region 25 as an emitter, region 24 as a base, and substrate 1 as a collector has been shown. The connection between control terminal G and the base of this transistor is ensured via a resistor R2 and the connection between control terminal G and the gate of MOS transistor T3 is ensured via a resistor R3. As an example, resistor R2 may have a value on the order of some hundred kilo-ohms and resistor R3 may have a value on the order of some hundred ohms.

The operation of this device is the following.

Whatever the biasing of terminal A2 with respect to terminal A1, the circuit is controlled by the application of a positive voltage to terminal G.

In a positive halfwave, that is, when terminal A2 is positive with respect to terminal A1, and when a positive signal is applied to terminal G, MOS transistor T3 turns on and a current flows from metallization M5 to metallization M6 in diode 24-25 and in the MOS transistor towards terminal A1. The turning-on of diode 24-25 causes the injection of electrons by $N^+$ region 25. A portion of these electrons, limited due to the strong value of resistor R2, continues to terminal G. Another portion of these electrons reaches substrate 1 and is attracted by the anode formed of layer 4-5 connected by metallization M2 to terminal A2. This results in an injection of holes by region 4-5 to the junction between substrate 1 and lower P layer 2. Due to the presence of insulating layer 23, this injection essentially occurs in the power area and this results in the turning-on of thyristor Th2.

A symmetrical operation occurs when terminal A2 is negative with respect to terminal A1 (negative halfwave). Then, the application of a positive voltage on terminal G turns on MOS transistor T3, a current flows in diode 24-25. This results in an injection of electrons into the substrate. This time, these electrons are directed towards layer 2 which is connected to positive terminal A1 and this layer 2 injects holes into the substrate which tend to unblock the blocking junction of thyristor Th1 between substrate 1 and P-type well 4.

According to an advantage of the present invention, when no signal is applied on terminal G, MOS transistor T3 is blocked and does not conduct any current. Thus, in the absence of a gate signal, NPN transistor T2 in series with MOS transistor T3 has its emitter floating and can by no means become conductive, even if charges are injected into the substrate by various parasitic effects, for example, by application of a strong current variation according to the time (dV/dt) between terminals A2 and A1. This results, on the one hand, in that a transistor T2 with a very high gain can be selected, and on the other hand, in that an assembly of two particularly sensitive thyristors can be selected. A transistor with a high gain can be obtained by optimizing well 24 so that, especially, the thickness of the base (24) between emitter and collector is small. Sensitive thyristors may for example result from an optimized topology and from a small density of emitter short-circuits. This results in that transistor T2 can be triggered by a very small current, and in that a resistor R2 of high value can be placed in series on its base. Thus, in the subsequent control and operation, an extremely small current is injected into the base of transistor T2. This results in that there is in practice a voltage control and no longer a current control as in prior art.

Figure 3A:
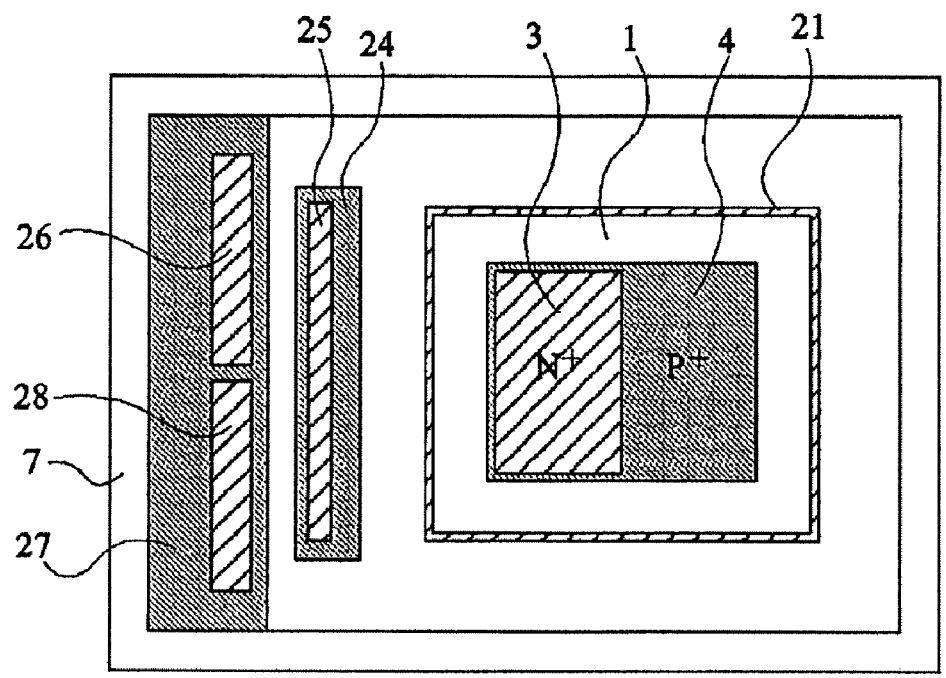
FIGS. 3A and 3B respectively are a top view and a bottom view of a first embodiment of a bi-directional switch according to the present invention.
Figure 3B:
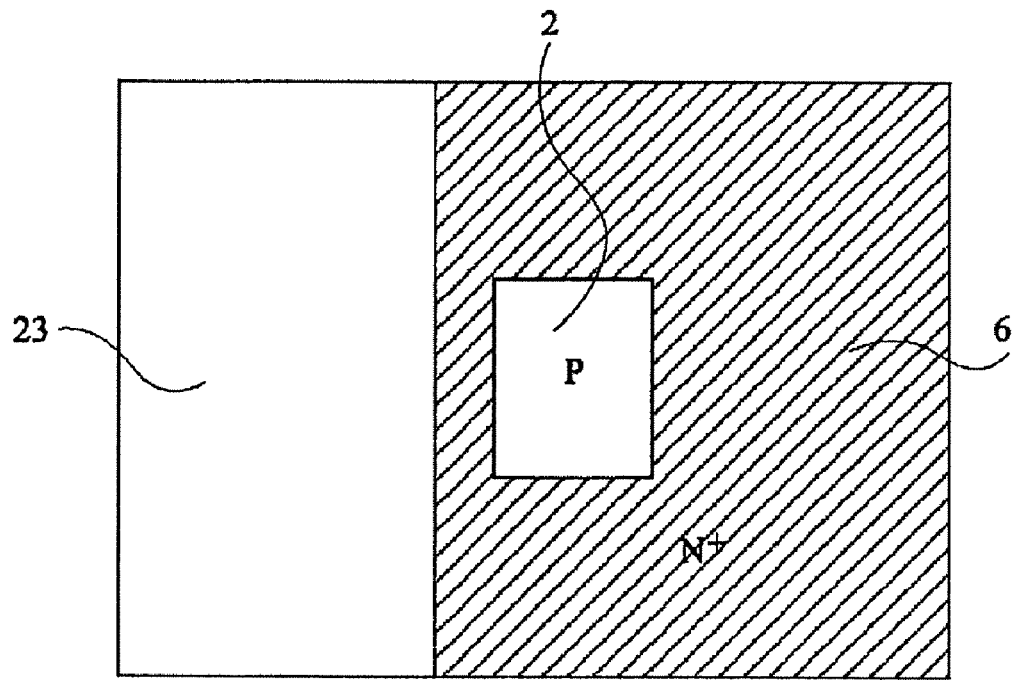
Figure 4A:
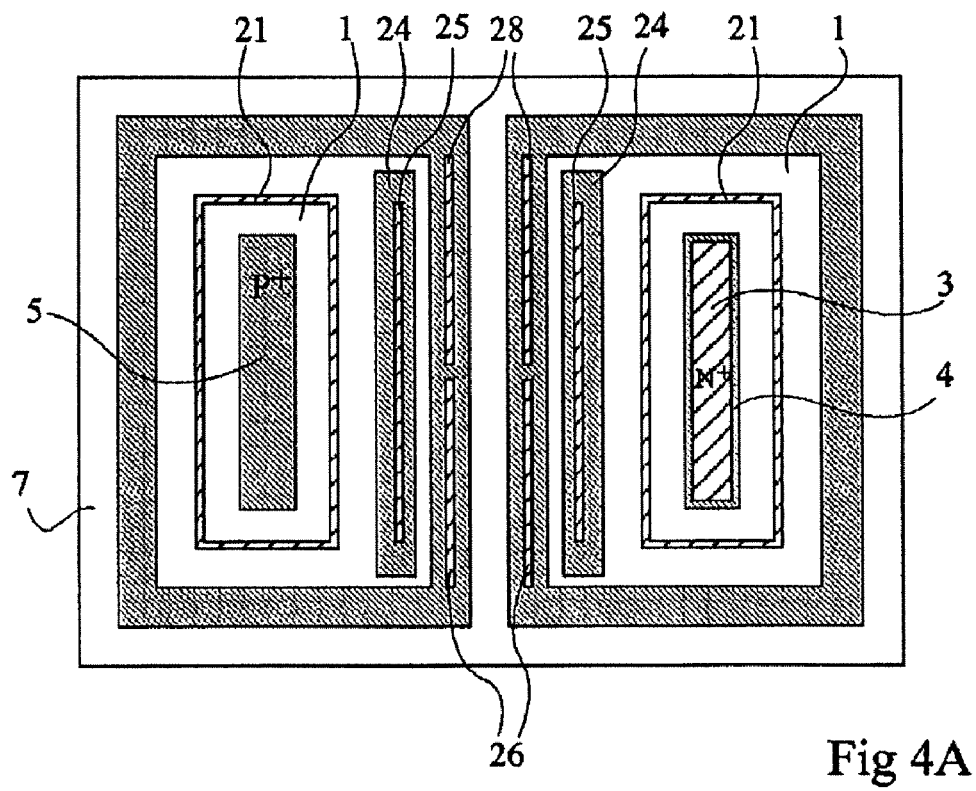
FIGS. 4A and 4B respectively are a top view and a bottom view of a second embodiment of a bi-directional switch according to the present invention.
Figure 4B:
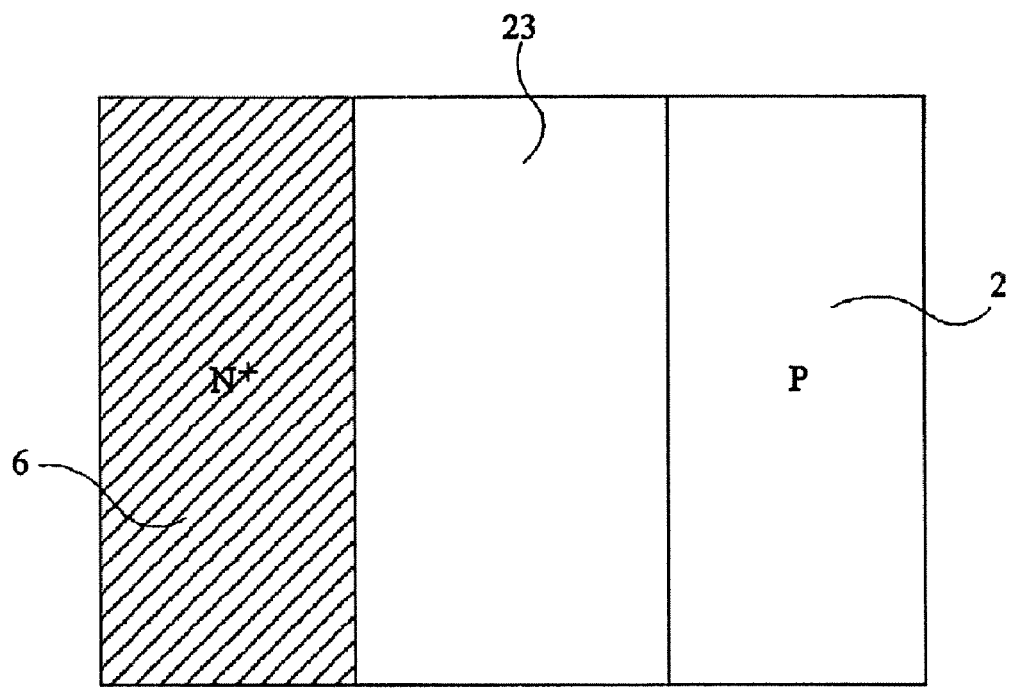

Two more detailed examples of embodiment of the present invention are respectively illustrated in the top and bottom views of FIGS. 3A and 3B and in the top and bottom views of FIGS. 4A and 4B. In these top and bottom views, the metallizations have been eliminated, but how to arrange them will be understood from the simplified cross-section view of FIG. 2A and from the circuit diagram of FIG. 2B.

In the embodiment of FIGS. 3A and 3B, as in the simplified cross-section view of FIG. 2A, P-type wells 4 and 5 form one and the same well. It should be understood that the channel area of MOS transistor T3 is arranged in the opposite portions of $N^+$-type regions 26, 28.

In the example of FIGS. 4A and 4B, the two thyristors Th1 and Th2 are separate and arranged on either side of the structure. Wells 4 and 5 are thus distinct and insulating wall 7 comprises a median portion separating the two structures. Two control areas are arranged symmetrically with respect to the median portion of the insulating wall, each substantially having the same structure as what has been shown and described previously.

Of course, FIGS. 3 and 4 only show certain specific examples of embodiment of the present invention. Many other practical embodiments will occur to those skilled in the art as to the topology of the various layers, according to a concept of present invention being forming, in monolithic form, of a circuit corresponding to that which is illustrated in FIG. 2B.

The present invention is likely to have various, alterations, improvements, and modifications which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A voltage-controlled vertical bi-directional monolithic switch, the switch being referenced with respect to a first surface of the switch, the switch being formed from a lightly-doped N-type semiconductor substrate, the switch comprising:
   a control structure to control a conductive state of the switch, the control structure comprising, on a second surface side opposite the first surface, a first P-type well in which is formed an N-type region, and a second P-type well in which is formed a MOS transistor, the first P-type well and a gate of the MOS transistor being electrically connected to a control terminal, said N-type region being electrically connected to a main terminal of the MOS transistor, and a second main terminal of the MOS transistor being electrically connected to the first surface of the switch;
   a power area comprising at least one component for conducting a current through the switch; and
   on the first surface side, between the semiconductor substrate and a first surface metallization connected to the first surface, an insulating layer extending at least under the control structure comprising at least the first P-type well and the second P-type well and not under the power area of the switch.

2. The switch of claim 1, wherein the semiconductor substrate is surrounded with a heavily-doped P-type wall in contact with the first surface metallization, the connection between the second main terminal of the MOS transistor and the first surface is provided by a metallization connecting the second main terminal of the MOS transistor to an upper surface of said heavily-doped P-type wall.

3. The switch of claim 1, wherein
   the control terminal is coupled to the first P-type well via a first resistor having a first resistance, and
   the control terminal is coupled to the gate of the MOS transistor via a second resistor having a second resistance, the first resistance being higher than the second resistance.

4. The switch of claim 3, wherein a value of the first resistance is at least 100 kilo-ohms and a value of the second resistance is smaller than 100 ohms.

5. The switch of claim 1, wherein the power area comprises a first thyristor and a second thyristor.

6. A voltage-controlled vertical bi-directional monolithic switch, the switch being referenced with respect to a first surface of the switch, the switch being formed from a lightly-doped semiconductor substrate of a first conductivity type, the switch comprising:
   a control structure to control a conductive state of the switch, the control structure comprising, on a second surface side opposite the first surface, a first well of a second conductivity type in which is formed a second region of the first conductivity type, and a second well of the second conductivity type in which is formed a MOS transistor, the first well and a gate of the MOS transistor being electrically connected to a control terminal, said second region being electrically connected to a main terminal of the MOS transistor, and a second main terminal of the MOS transistor being electrically connected to the first surface of the switch;
   a power area comprising at least one component for conducting a current through the switch; and
   on the first surface side, between the semiconductor substrate and a first surface metallization connected to the first surface, an insulating layer extending at least under the control structure comprising at least the first well and the second well and not under the power area of the switch.

7. The switch of claim 6, wherein the semiconductor substrate is surrounded with a heavily-doped wall of the second conductivity type in contact with the first surface metallization, the connection between the second main terminal of the MOS transistor and the first surface is provided by a metallization connecting the second main terminal of the MOS transistor to an upper surface of said heavily-doped wall.

8. The switch of claim 6, wherein the control terminal is coupled to the first well via a first resistor having a first resistance, and
   the control terminal is coupled to the gate of the MOS transistor via a second resistor having a second resistance, the first resistance being higher than the second resistance.

9. The switch of claim 8, wherein a value of the first resistance is at least 100 kilo-ohms and a value of the second resistance is smaller than 100 ohms.

10. The switch of claim 6, wherein the power area comprises a first thyristor and a second thyristor.

* * * * *